United States Patent
Ahlstedt et al.

(10) Patent No.: US 9,299,878 B2
(45) Date of Patent: Mar. 29, 2016

(54) LUMINESCENCE CONVERSION ELEMENT, METHOD FOR THE MANUFACTURE THEREOF AND OPTOELECTRONIC COMPONENT HAVING A LUMINESCENCE CONVERSION ELEMENT

(75) Inventors: Mikael Ahlstedt, Munich (DE); Ute Liepold, Munich (DE); Carsten Schuh, Baldham (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 2 days.

(21) Appl. No.: 13/881,995

(22) PCT Filed: Nov. 8, 2011

(86) PCT No.: PCT/EP2011/069652
§ 371 (c)(1),
(2), (4) Date: Jul. 15, 2013

(87) PCT Pub. No.: WO2012/062758
PCT Pub. Date: May 18, 2012

(65) Prior Publication Data
US 2013/0299862 A1   Nov. 14, 2013

(30) Foreign Application Priority Data

Nov. 9, 2010   (DE) .......................... 10 2010 050 832

(51) Int. Cl.
*H01L 33/00* (2010.01)
*H01L 33/50* (2010.01)
*H05B 33/10* (2006.01)

(52) U.S. Cl.
CPC .............. *H01L 33/005* (2013.01); *H01L 33/50* (2013.01); *H05B 33/10* (2013.01); *H01L 2224/48091* (2013.01); *Y10T 29/49* (2015.01); *Y10T 428/24273* (2015.01)

(58) Field of Classification Search
CPC ............. H01L 2924/0002; H01L 2224/40891; H01L 2924/00; H01L 2924/00014; H01L 33/50; H01L 33/005; H05B 33/10; Y10T 29/49
USPC ........... 438/22, 25, 26, 27, 29; 257/98, 99, 91
See application file for complete search history.

(56) References Cited

U.S. PATENT DOCUMENTS

| 5,527,480 A | 6/1996 | Bailey et al. |
| 6,616,862 B2 | 9/2003 | Srivastava et al. |

(Continued)

FOREIGN PATENT DOCUMENTS

| CN | 101185172 A | 5/2008 |
| DE | 100 36 940 A1 | 2/2002 |

(Continued)

*Primary Examiner* — Thinh T Nguyen
(74) *Attorney, Agent, or Firm* — Slater & Matsil, L.L.P.

(57) ABSTRACT

A method for manufacturing a ceramic luminescence conversion element includes providing a shaped body having a first main surface, a second main surface and a first lateral surface. The shaped body includes a ceramic material and a luminescence conversion substance. The first main surface and/or the second main surface of the shaped body is/are machined using a patterning method, so that at least one first machined area and at least one unmachined area are formed. The first machined area extends essentially parallel to the first lateral surface. Singularization is performed to produce a plurality of luminescence conversion elements by means of cuts that are made in the machined main surface of the machined shaped body essentially at right angles to the first lateral surface.

16 Claims, 5 Drawing Sheets

(56) References Cited

U.S. PATENT DOCUMENTS

| | | | |
|---|---|---|---|
| 6,650,046 B2 * | 11/2003 | Shirakawa et al. | 313/506 |
| 7,800,123 B2 | 9/2010 | Bechtel et al. | |
| 8,679,866 B2 | 3/2014 | Shimizu et al. | |
| 8,684,562 B2 | 4/2014 | Ishimori et al. | |
| 2004/0062699 A1 | 4/2004 | Oshio | |
| 2008/0036362 A1 * | 2/2008 | Tanimoto et al. | 313/498 |
| 2008/0121911 A1 * | 5/2008 | Andrews et al. | 257/98 |
| 2009/0065790 A1 * | 3/2009 | Chitnis et al. | 257/88 |
| 2009/0066221 A1 | 3/2009 | Schmidt et al. | |
| 2010/0012955 A1 * | 1/2010 | Sorg et al. | 257/88 |
| 2010/0187976 A1 * | 7/2010 | Winkler | 313/504 |
| 2010/0244067 A1 * | 9/2010 | Winkler et al. | 257/98 |
| 2011/0062482 A1 * | 3/2011 | Solomensky et al. | 257/99 |
| 2011/0260193 A1 | 10/2011 | Kraeuter | |
| 2012/0326186 A2 * | 12/2012 | Kraeuter | 257/98 |

FOREIGN PATENT DOCUMENTS

| | | |
|---|---|---|
| DE | 101 47 040 A1 | 4/2003 |
| DE | 103 49 038 A1 | 5/2004 |
| DE | 10 2006 037 730 A1 | 2/2008 |
| DE | 10 2006 054 330 A1 | 5/2008 |
| DE | 10 2007 016 228 A1 | 10/2008 |
| DE | 10 2008 052 751 A1 | 4/2010 |
| JP | 2001214162 A | 8/2001 |
| JP | 2001319360 A | 11/2001 |
| JP | 2003294922 A | 10/2003 |
| JP | 2004133149 A | 4/2004 |
| JP | 2005159035 A | 6/2005 |
| JP | 2006332692 A | 12/2006 |
| JP | 200855519 A | 3/2008 |
| JP | 2008542988 A | 11/2008 |
| JP | 2009530788 A | 8/2009 |
| JP | 2010500704 A | 1/2010 |
| JP | 2011519149 A | 6/2011 |
| TW | 201032358 A | 9/2010 |
| WO | WO 00/33390 A1 | 6/2000 |
| WO | WO 2006/126119 A2 | 11/2006 |
| WO | WO 2007/085977 A1 | 8/2007 |
| WO | 2009148176 A1 | 12/2009 |
| WO | WO 2010/045915 A1 | 4/2010 |

* cited by examiner

LUMINESCENCE CONVERSION ELEMENT, METHOD FOR THE MANUFACTURE THEREOF AND OPTOELECTRONIC COMPONENT HAVING A LUMINESCENCE CONVERSION ELEMENT

This patent application is a national phase filing under section 371 of PCT/EP2011/069652, filed Nov. 8, 2011, which claims the priority of German patent application 10 2010 050 832.2, filed Nov. 9, 2010, each of which is incorporated herein by reference in its entirety.

TECHNICAL FIELD

The present application relates to a method for manufacturing a luminescence conversion element, to a luminescence conversion element which can be produced by the method and which has a cutout, and to an optoelectronic component having such a luminescence conversion element.

BACKGROUND

The manufacture of luminescence conversion elements having a cutout, for example, a cutout in order to provide space for the connection of a bonding wire, regularly leads to relatively large amounts of rejects. The mechanical processing required often produces cracks and defects in the luminescence conversion element which result in the conversion element being unusable. Moreover, abrasive processing methods can result in an undesirable curvature of the ceramic luminescence conversion element.

SUMMARY OF THE INVENTION

Embodiments of the invention specify an improved method for manufacturing ceramic luminescence conversion elements, in particular ceramic luminescence conversion elements having cutouts, and a ceramic luminescence conversion element manufactured by the method, and an optoelectronic component having such a luminescence conversion element.

In accordance with one embodiment, the method for manufacturing a luminescence conversion element comprising a ceramic comprises the following steps: A) A shaped body having a first and a second main surface and at least one first lateral surface is provided. In this case, the at least one first lateral surface is embodied, in particular, in a manner adjoining the first and second main surfaces. In this case, the shaped body provided comprises a ceramic material and a luminescence conversion substance. B) In a further step, the shaped body is processed by means of a structuring method. In this case, at least one first processed region and at least one unprocessed region are formed in the first main surface and/or the second main surface. In particular, the first processed region can in this case extend substantially parallel to the first lateral surface. In a step C), the structured shaped body is singulated to form a plurality of the ceramic luminescence conversion elements. In this case, the singulation is effected in such a way that cuts running substantially orthogonally with respect to the first lateral surface are introduced into the processed main surface of the processed shaped body. In this case, the cuts are introduced such that an individual luminescence conversion element is completely separated from the remainder of the processed shaped body. In this case, the term processed shaped body in step C) should be understood such that the cuts can be introduced not just into a shaped body which substantially corresponds to the dimensions of the shaped body provided in step A), rather that partial bodies formed in possible further sub-steps, for example, also come under the wording "processed shaped body."

A luminescence conversion element comprising a ceramic (also called "ceramic luminescence conversion element" in the context of this application) should be understood to mean, in accordance with the application, a luminescence conversion element which for the most part comprises ceramic material. "For the most part" means that the ceramic material takes up a proportion by weight of more than 50%, in particular of more than 75%, and preferably of more than 90%, of the weight of the luminescence conversion element. The luminescence conversion element often consists of the ceramic material.

A ceramic material should be understood here to mean, in particular, an oxide-containing material or a nitride-containing material, wherein, in accordance with the application, materials which have only a short-range order and no long-range order, also come under the term "ceramic material" as well. Accordingly, inorganic glasses are also encompassed by the wording "ceramic material."

The structuring method in accordance with the application in accordance with step B) is carried out, in particular, in such a way that a recess is introduced into the respective main surface, in particular a recess in the manner of a groove or in the manner of a fold (which is also understood to mean a hollow groove, for example). In this case, the three-dimensional form of the structuring introduced is not restricted to angular bodies; rather, any geometrical form is conceivable.

In general, the depth of the structuring will be in a similar range over the entire (longitudinal) extent, that is to say, in particular, that the depth really measured at a point will not fluctuate more than 50%, in particular 20%, often 10%, upward and downward around the average depth (ascertained by determining the respective maximum depth in the longitudinal direction). In the extreme case, the "recess" can also be embodied in such a way that both surfaces are processed by the structuring method, that is to say that a complete cut is made through the shaped body. In this extreme case, for example rectangular or square plates of the luminescence conversion element which have no recess are then obtained in step C). In general, however, the method in accordance with step B) is carried out such that only one of the two main surfaces is processed by means of the structuring method.

In principle, the shaped body processed in step B) can have any geometrical form, for instance the form of a circular cylinder or of a cylinder having an elliptical base face or of a straight prism having an arbitrary polygonal base face. Often, however, the shaped body will have a substantially parallelepipedal (or tile-shaped) or cubic shape.

Singulating the luminescence conversion elements in accordance with step C) can be effected by an arbitrary singulation method, for example, by means of a grinding or sawing method (for example, by means of a cutting method by means of wire dicing, water jet cutting, internal hole diameter sawing or else by means of high-energy radiation, for instance, by means of laser cutting). Corresponding methods can also be used for the surface processing in step B) and step D), which will not be described until later below.

The method in accordance with the application has, in particular, the following advantages.

First, it is possible to prevent the manufacture of the luminescence conversion elements from incurring a high level of rejects similar to that according to the prior art, since structuring is not introduced into a thin plate, but rather into a relatively large-format shaped body, which by its nature is less susceptible to mechanical damage such as, for example, the production of cracks. A particularly small tendency toward forming cracks can be registered in this case in particular when no edges (that is to say no "corners" pointing toward the interior of the shaped body, such as are present in the case of a fold, for instance) are formed during the structuring, if the structuring is embodied in the manner of a fillet, for example.

Secondly, the generated secondary radiation of the luminescence conversion element manufactured by the method in accordance with the application can be set significantly more accurately, without having to implement additional post-processing steps for fine adjustment. This is because, before carrying out step C) or else, if appropriate, already before carrying out step B), in relation to a primary radiation to be converted it is possible already to estimate what wavelength spectrum of the secondary radiation can be generated by means of a luminescence conversion element having a specific thickness (or what wavelength spectrum the secondary radiation will have in relation to the wavelength spectrum of the primary radiation). The luminescence conversion element thickness, adjustable in step C), can then be chosen, through corresponding control of the placement of cuts, such that the desired secondary radiation or the desired wavelength spectrum of secondary radiation is obtained. By means of the mixing of a given primary radiation emitted by a radiation-emitting component and the secondary radiation generated by at least partial conversion of said primary radiation by the luminescence conversion element, it is therefore also possible to set the desired color locus of a total radiation formed from primary radiation and secondary radiation.

The desired secondary radiation or the total radiation can be set even more accurately by virtue of the fact that, in relation to a shaped body, the respective first singulated luminescence conversion element is measured accurately and the wavelength or color of the secondary radiation obtained with the given thickness of the first singulated luminescence conversion element, or of the resulting total radiation, is used to ascertain how the thickness of the luminescence conversion elements that are subsequently to be singulated should be chosen in order to obtain a specifically desired color impression of the secondary radiation or of the total radiation.

According to the prior art, the color impression of the secondary or total radiation can be accurately adjusted substantially by virtue of the inherently finished luminescence conversion elements being ground until a specific thickness and thus a specific color impression are obtained. This is not necessary with the method in accordance with the application. The fine adjustment effected before the singulation makes it possible, without any problems, to compensate for tolerances that arise, for example, as a result of differences in the quality of the luminescence conversion material used, which are formed as a result of slight differences when carrying out the sintering or the injection molding method for manufacturing the luminescence conversion elements (for instance, as a result of the production of pores in the ceramic luminescence conversion element) or which arise as a result of cumulated deviations from the average layer thickness of a ceramic green sheet in the case of laminated ceramic films for manufacturing the luminescence conversion element. The abovementioned problem area can therefore be completely disregarded by as it were working orthogonally compared with the customary "manufacturing direction" in the previously known production of ceramic luminescence conversion elements.

In accordance with a further embodiment of the method in accordance with the application, before or after step B), a step D) is additionally carried out. This step D) will be implemented, in particular, whenever only either the first or the second main surface is processed in step B). Step D) involves processing the first and second main surfaces, such that at least two partial bodies are formed from the hitherto in particular integral shaped body. During the processing in accordance with step D), in this case a second processed region is formed, which extends substantially parallel to the first lateral surface (and—if step D) is carried out before step B)—thus also extends substantially parallel to the first processed region).

In the sense of the present application, substantially parallel means that the method is carried out such that luminescence conversion elements having substantially an identical shape are formed from one and the same shaped body. The tolerances with regard to dimensions and/or area content of the surfaces of the luminescence conversion element is therefore in particular a maximum of 10%. Independently of this, the tolerance of the area contents of the cutout (in relation to a corresponding luminescence conversion element without a cutout) is a maximum of 50%. In this case, tolerance is understood to be the value ascertained by the difference between maximum and minimum.

By means of step D), therefore, a multiplicity of rod-shaped partial bodies can be formed from a, for example, tile-shaped, shaped body. If a multiplicity of partial bodies are formed, then the method in accordance with the application is carried out, in particular, in such a way that each of the partial bodies has processed and unprocessed regions introduced in step B). From the multiplicity of, for example, rod-shaped, elements, a singulation to form the luminescence conversion element can then be effected for example in one method step simultaneously in each case for each partial shaped body, such that a number of luminescence conversion elements corresponding to that of the partial shaped bodies used is obtained for each cut carried out in accordance with step C). In order to perform the fine adjustment of the color beforehand, the emitted secondary or total radiation can be measured, of course, on the basis of a first luminescence conversion element singulated from an individual partial shaped body.

If the method in accordance with the application comprises a step D) that is carried out after step B), then in accordance with one embodiment of the present application the surface processing in accordance with step B) can also be effected simultaneously for two adjacent partial shaped bodies. In this case, the width of the recess introduced in step B) is expediently chosen such that it is composed of the sum of the desired width of the recess for the formed luminescence conversion elements of the two partial shaped bodies and the width of cut of the saw blade for carrying out step D) or the width of cut of an alternatively used cutting or separating means for step D).

In accordance with one embodiment, step B) can also be effected repeatedly, for instance, in order to produce luminescence conversion elements having a plurality of recesses (for example, at two, three of four corners of a square or rectangular luminescence conversion element).

In accordance with one embodiment, the luminescence conversion substance is formed by a doped ceramic material. The ceramic material of the shaped body provided in step A) therefore, comprises a ceramic material which is at least partly doped with a dopant. The ceramic material can be completely doped with the dopant. However, it is also possible for only a part, for example, in the region of one of the main surfaces, to be doped with the dopant.

In this case, the ceramic shaped body can contain one or more dopants, for example, selected from cerium, europium, neodymium, terbium, erbium or praseodymium.

The ceramic material can be selected, in particular, from garnets of the rare earths and the alkaline earth metal elements, in particular as disclosed, for example, in U.S. Patent Publication No. 2004/062699 and the prior art described therein. For instance, cerium-doped yttrium aluminum garnets and cerium-doped lutetium aluminum garnets shall be mentioned.

Generally, however, the term luminescence conversion substance can also be formulated more broadly and, in particular, if appropriate also in combination with the above garnets, comprise the following materials:

- chlorosilicates, as disclosed, for example, in German Patent Publication No. DE 10036940 and the prior art described therein,
- orthosilicates, sulfides, thiogallates and vanadates as disclosed, for example, in International Patent Publication No. WO 2000/33390 and the prior art disclosed therein,
- aluminates, oxides, halophosphates, as disclosed, for example, in U.S. Pat. No. 6,616,862 and the prior art disclosed therein, and
- nitrides, sions and sialons as disclosed, for example, in German Patent Publication No. DE 10147040 and the prior art described therein.

The ceramic material then forms as it were only the matrix for the luminescence conversion substance and can be an arbitrary oxidic or nitridic material—as explained above.

In accordance with a further embodiment, the ceramic shaped body can contain, alongside the luminescence conversion material, still further, in particular, inorganic particles having, in particular, no wavelength-converting properties. Appropriate further particles in this case include, for example, nitrides and oxides of the elements aluminum, boron, titanium, zirconium and silicon or mixtures of two or more of the abovementioned materials.

The ceramic material of the shaped body comprises, in particular, luminescence conversion substance particles that are joined together and/or to further particles to form the ceramic material. The joining of the luminescence conversion substance particles among one another and/or to the further particles of the ceramic material is at least partly formed by sinter necks. Alternatively or additionally, grain boundaries can also be formed between adjacent—and in particular areally adjoining—particles. In this case, the ceramic material can consist, for example, of the luminescence conversion substance particles.

In accordance with a further embodiment, the method in accordance with the application can be carried out such that, before step B), C) or D), the at least one processed shaped body and/or at least one of the processed partial bodies are/is fixed on an auxiliary carrier.

The auxiliary carrier can in this case serve in particular, to stabilize the subsequently singulated luminescence conversion elements and to supply them in an ordered form to a further processing step, for example, for manufacturing a light-emitting diode. Furthermore, by means of the auxiliary carrier, the shaped bodies or partial bodies can be adjusted, such that the processing to be introduced in steps B) and/or D) and the singulating in accordance with step C) or that is to say the first and second processed regions and the cuts can be introduced in as defined a manner as possible.

The fixing of the shaped body and/or partial body on the auxiliary carrier can in this case be effected by means of adhesives, adhesion promoters or else other substances, which produce re-releasable cohesive connections between auxiliary carrier and shaped body and/or partial body. The later release of the luminescence conversion elements or of other partial shaped bodies obtained in intermediate steps can be effected, for example, by means of solvents or elevated temperature (for example, burn-out or depolymerization).

In accordance with one variant of this embodiment, the processed shaped body is fixed in a recess of the auxiliary carrier. In this case, the recess has a width chosen such that the shaped body and/or partial body can be at least partly "sunk" therein, and the remaining joints between shaped body/partial body and auxiliary carrier should turn out to be as narrow as possible—in order to save "fixing material" (that is to say adhesive, for example).

The singulated luminescence conversion elements can be additionally stabilized by means of an auxiliary carrier having a recess.

Generally, the auxiliary carriers with or without a recess can also be chosen such that the auxiliary carrier is not completely severed during singulation, such that the luminescence conversion elements formed during singulation are still all jointly connected to one another via the remaining residues of the auxiliary carrier even after singulation.

In accordance with a further embodiment, the auxiliary carrier can be formed from glass or from a ceramic. The material of the auxiliary carrier will often be formed in this case such that the auxiliary carrier material is adapted to the material of the shaped body in terms of the mechanical properties with regard to the sawing or grinding methods used, thus resulting in uniform loading of the singulating or processing means. By way of example, the material of the auxiliary carrier can comprise aluminum oxide or consist thereof. A particularly good adaptation is effected, for example, in the case of luminescence conversion materials based on garnet on an auxiliary carrier composed of aluminum oxide.

Alternatively, the auxiliary carrier can also be formed from a polymer or comprise the latter.

In accordance with a further embodiment, the method in accordance with the application is carried out such that the distance between the main surfaces of the shaped body provided in step A) is set such that it substantially corresponds to the distance between opposite side faces of the luminescence conversion element formed (wherein side faces should be understood to mean the faces which are situated laterally between the main surfaces of the luminescence conversion element). Therefore, the dimensioning of the later luminescence conversion element can already be partly predetermined by the thickness of the shaped body provided.

Since, as explained above, for example, in the case of sintering methods for manufacturing a shaped body, the concrete dimensions of a shaped body can deviate from one another, the main surfaces of the shaped body (but also the first and all further lateral surfaces of the shaped body or even only of a partial body formed in step D)) can be treated by means of grinding. As a result, it is then possible to set, if appropriate, not only the distance between the main surfaces of the shaped body provided, but generally (for instance, in relation to the number of uniform partial shaped bodies to be produced later) also all dimensions apart from the thickness of the luminescence conversion element to be produced.

As already explained, it is possible to produce the shaped body in accordance with step A) by means of any arbitrary method for manufacturing ceramic components, for example, by an injection molding method or by sintering of a green body manufactured by tape casting, uniaxial pressing, cold isostatic pressing, hot pressing or hot isostatic pressing.

In accordance with one embodiment, the luminescence conversion elements obtained in step C) each have a thickness of approximately 50 to approximately 200 µm. The deviation of the thickness within a multiplicity of luminescence conversion elements of identical type is in this case in the range of one to a few micrometers. Should it actually be necessary also to readjust the luminescence conversion elements with regard to emitted secondary radiation or total radiation, then in individual cases the main surfaces of the luminescence conversion elements can once again be subjected to an abrasive treatment. In general, however, this will not be necessary.

The application furthermore specifies a ceramic luminescence conversion element having a cutout which can be obtained in accordance with one or more of the above embodiments of the method. In this case, the luminescence conversion elements formed differ from other ceramic luminescence conversion elements in accordance with the prior art to the effect that, at the main surfaces of the luminescence conversion element, the introduction of the cut in accordance with method step C) is recognizable on the basis of the sawing or grinding traces. In particular, however, the processing by means of a mechanical structuring method can also be recognized at the lateral faces of the luminescence conversion element in the region of the cutout.

The ceramic luminescence conversion element is in the form of a plate, in particular. It can furthermore assume any arbitrary geometrical form and have not just one cutout but a plurality of cutouts. By way of example, an L-shaped, T-shaped or cruciform shape of the plate formed or of some other form that is formed can arise as a result. A cruciform plate can serve, for example, to provide a common luminescence conversion element for four radiation sources which are arranged alongside one another in a square form and are each contact-connected via a bonding wire.

In accordance with one embodiment, the luminescence conversion element can have at least one main surface having a structuring at least in partial regions. An improved coupling-in and/or coupling-out of radiation into and/or from the luminescence conversion element can be effected by means of such a structuring.

In accordance with one embodiment, the structuring can be formed by a roughening of one of the main surfaces of the luminescence conversion element, but it is also possible to form additional scattering centers, for instance, composed of aluminum oxide, titanium dioxide, yttrium aluminum garnet and/or yttrium oxide, on the main surface.

An optoelectronic component having a luminescence conversion element in accordance with one or more of the embodiments described above also comprises at least one radiation-emitting semiconductor chip in addition to the luminescence conversion element. In this case, the luminescence conversion element converts primary radiation emitted by the semiconductor chip at least partly into a secondary radiation, thus resulting in a total radiation which appears as white light, for example, to the observer. However, the generation of other color impressions may also be desired.

In this case, the semiconductor chip can comprise an arbitrary semiconductor material for emitting the primary radiation. By way of example, UV radiation from the range of 370 to 400 nm can be emitted. The semiconductor chip can furthermore comprise a semiconductor material which is selected from gallium indium nitride and/or gallium nitride, for example, and which emits, in particular, blue primary radiation (for example 400 to 480 nm) upon electrical driving. In combination with a luminescence conversion substance (for example, a cerium-doped yttrium aluminum garnet) effecting conversion to yellow secondary radiation, a component which emits white light can be obtained in this case.

BRIEF DESCRIPTION OF THE DRAWINGS

Further advantages and advantageous embodiments and developments will become apparent from the embodiments described below in conjunction with the figures.

Identical or identically acting constituent parts are provided with the same reference signs in the figures. The sizes of the constituent parts and also the size relationships of the constituent parts among one another should not be regarded as true to scale.

DETAILED DESCRIPTION OF ILLUSTRATIVE EMBODIMENTS

Figure 1:
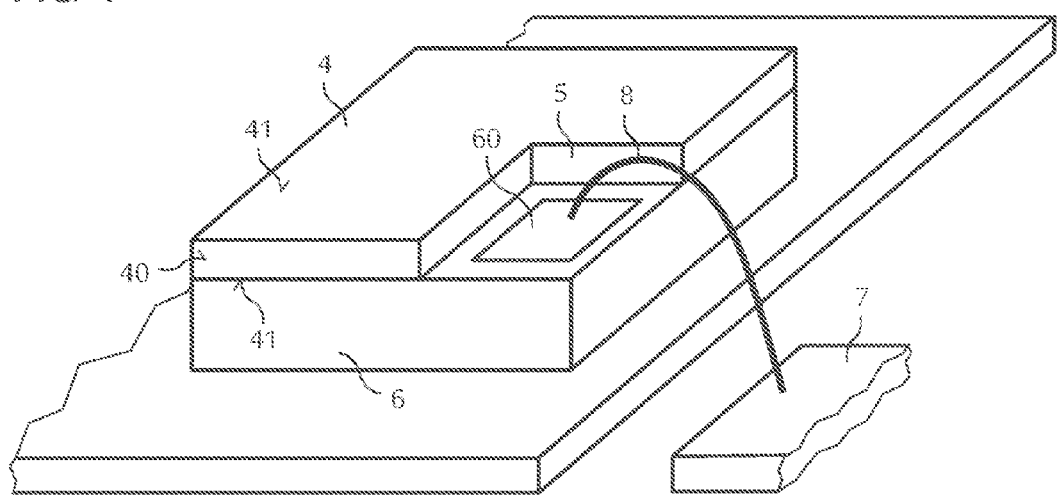
FIG. 1 shows a schematic perspective view of an optoelectronic component having a luminescence conversion element.

The optoelectronic component in accordance with FIG. 1 has a leadframe 7. A radiation-emitting semiconductor chip 6 is fixed on a first partial region of the leadframe 7. An L-shaped luminescence conversion element 4 in the form of a plate is arranged on said radiation-emitting semiconductor chip 6. The luminescence conversion element comprises two main surfaces 41. The luminescence conversion element 4 can be adhesively bonded, for example, on to the semiconductor chip 6; for the sake of simplicity, however, the illustration of an adhesive layer has been omitted. Between that main surface 41 of the luminescence conversion element 4 which faces the semiconductor chip 6 and the upwardly facing main surface 41 of the luminescence conversion element 4 that faces the observer of the generated radiation, the side face 40 of the luminescence conversion element 4 can be discerned here. The luminescence conversion element 4 has a cutout 5 revealing the exposed side of the semiconductor chip 6 facing the luminescence conversion element 4. This exposed corner region of the semiconductor chip 6 has an electrical connection area 60, which can be a bonding pad, in particular, on the area facing away from the leadframe 7. A bonding wire 8 connects the bonding pad 60 to a second partial region of the electrical leadframe 7, which is electrically insulated from the first partial region of the leadframe 7. The mounting of the luminescence conversion element 4 with the cutout 5 will usually be effected before or after electrical contact is made with the semiconductor chip 6 by means of the bonding wire 8.

The optoelectronic component, which can be a light-emitting diode component, for example, has a reflector trough in one configuration, said reflector trough being shaped from a plastic or ceramic material, for example, which is injection-molded around the leadframe. The reflector trough has been omitted in the present case in order to simplify the illustration.

FIGS. 2A to 2D show a method for manufacturing a multiplicity of luminescence conversion elements in accordance with an embodiment of the present application.

Figure 2A:
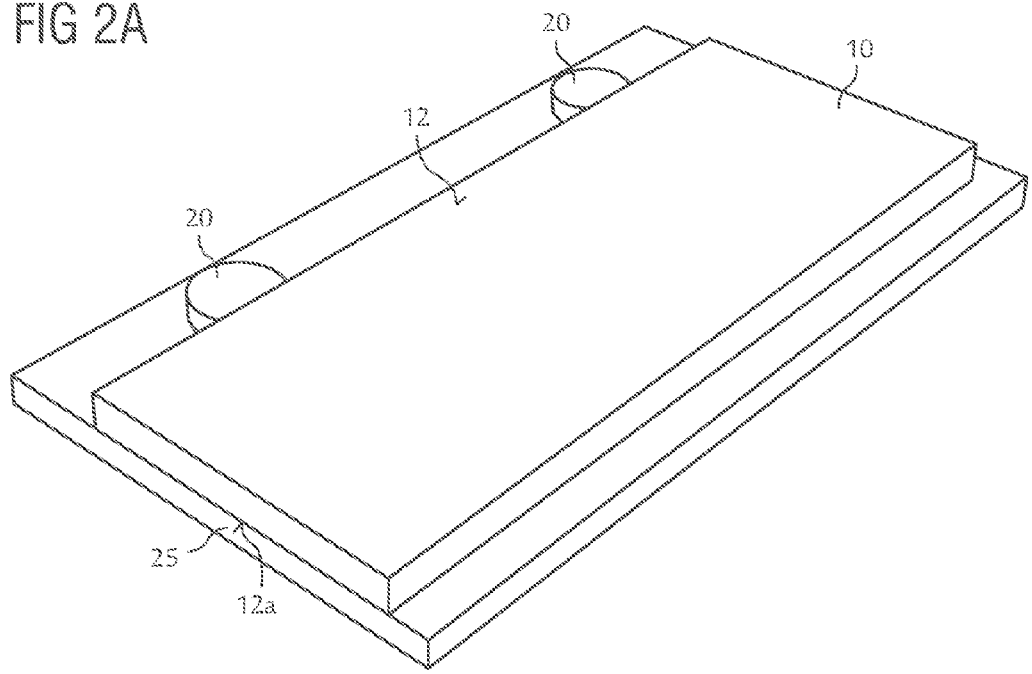
FIGS. 2A to 2D show an embodiment of the method for producing the ceramic luminescence conversion elements.

FIG. 2A shows a shaped body composed of a luminescence conversion material, for example, a cerium-doped yttrium aluminum garnet, which can have, for example, a dimensioning of 20×20 mm and a thickness of 1 mm. By means of two stops 20, the position of the shaped body 10 on a support 25 is adjusted or fixed such that processing in accordance with steps B) and D) and/or introduction of cuts in accordance with step C) are/is possible. The shaped body 10 comprises a first main surface 12 and a second main surface 12a. The shaped body 10 may adjoin the support with the second main surface 12a.

Figure 2B:
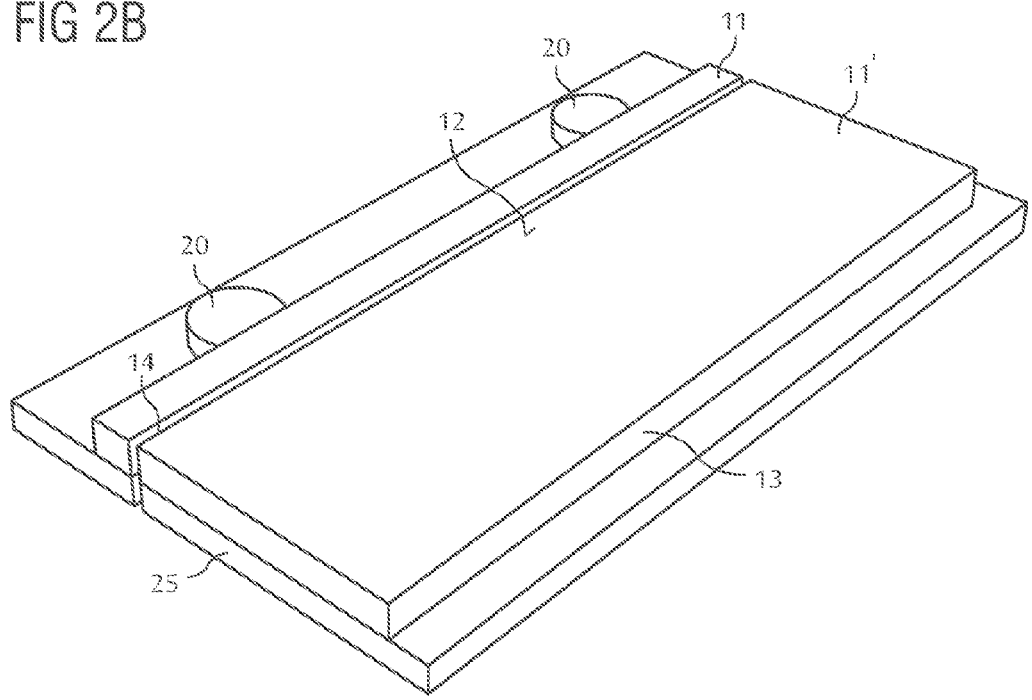

FIG. 2B shows the state after two partial shaped bodies 11, 11' have been formed from the shaped body 10. FIG. 2B shows an embodiment in which method step D) is carried out before method step B). In this case, the first main surface 12 of the shaped body 10 is processed such that a cut 14 parallel to the first lateral surface 13 of the shaped body 10 is introduced, such that a second processed region 16 (hidden in FIG. 2B) respectively arises in the region of the cut areas.

If the partial bodies are processed by means of a grinding disk, then the grinding disk can have a significantly larger thickness than the, for example, fold-type, structuring to be introduced. Thus, the fold-type structuring can have a width of 150 to 250 μm, for example, but the thickness of the grinding disk can be four to five times as thick. With regard to the dimensions of the grinding or sawing tools, therefore, a restriction is made by methods in accordance with the application neither in step B) nor in step C) or D).

In this case, by way of example, 14 partial bodies 11 which are of identical type and are in the form of small rods can be formed from a shaped body having a size of 20×20 mm.

Figure 2C:
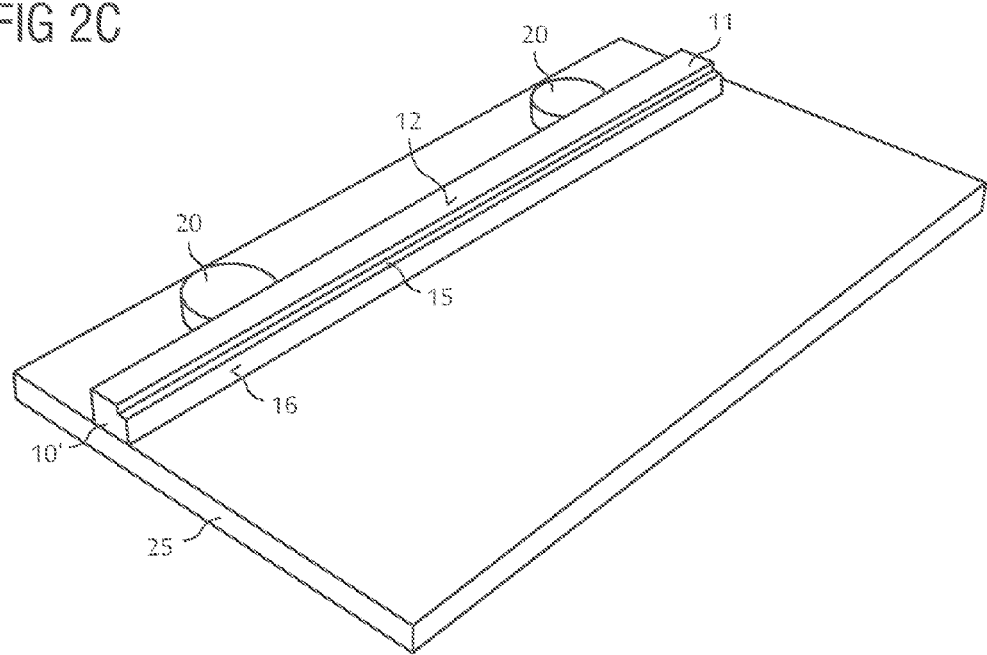

FIG. 2C shows the state after method step B) has also been carried out. For carrying out method step B), too, the stops 20 serve for adjustment, such that defined processing and defined introduction of the structuring can be affected. Only one partial body 11 is shown in FIG. 2C, but a plurality of partial bodies 11 (having identical, alternatively having different geometrical forms) can in principle also be processed simultaneously in method step B). In this case, a structuring or a first processed region 15 in the manner of a fold is introduced into the first main surface 12, for example, by means of a grinding method. Such a structuring may form a process shaped body 10'. In this case, the structuring again runs substantially parallel to the first lateral surface 13 formerly present, or the second processed region 16 formed in step D).

Figure 2D:
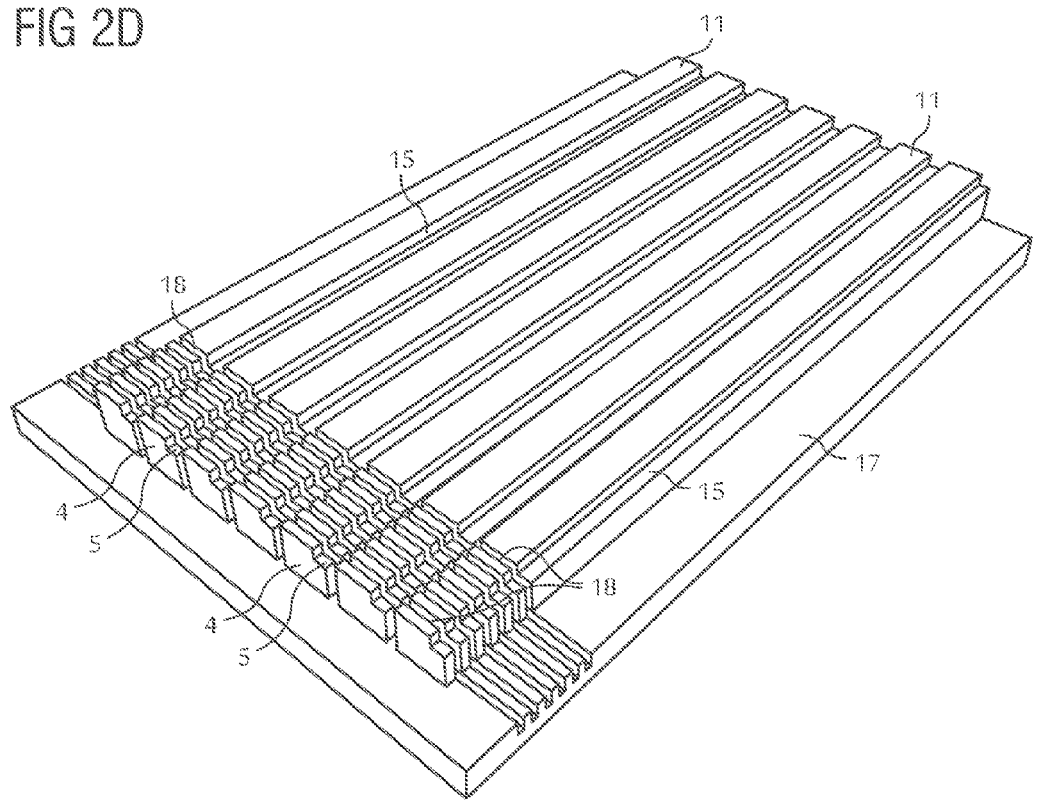

FIG. 2D shows the state after singulation of the luminescence conversion elements 4. It is evident that the partial bodies 11 in the form of small rods which were structured by means of step B) were arranged on an auxiliary carrier 17. In this case, for the sake of clarity, an illustration was chosen in which the auxiliary carrier 17 has no recesses for "sinking" the partial bodies 11. Such an auxiliary carrier 17 could have recesses in the form of parallel trenches, for example, in which the partial bodies 11 in the form of small rods are sunk for example up to half of the height. For the sake of simplicity, a fixing means for fixing the partial bodies 11 on the auxiliary carrier 17 is not illustrated either.

FIG. 2D reveals, then, that seven partial bodies 11 of identical type and in the form of small rods are arranged on the auxiliary carrier 17 in a manner arranged parallel to one another and alongside one another and each have a structuring 15 in the form of a fold. As a result of the singulation in accordance with step C), cuts 18 are introduced at the front end of the partial bodies 11, said cuts also partly extending into the auxiliary carrier 17. By means of said cuts 18, a multiplicity of luminescence conversion elements 4 were produced, in which a cutout 5 can be seen, which were formed from the fold-type structuring 15 by means of the cuts and which are still connected to one another via the auxiliary carrier 17.

The introduction of the structuring and/or of the cuts in accordance with FIGS. 2B to 2D can be effected, for example, by means of a precision saw (for instance a CNC saw). If, by way of example, an yttrium aluminum garnet shaped body is sawn from an aluminum oxide carrier, then an approximately identical wear as a result of both materials arises.

From a shaped body having a size of 20×20 mm it is possible to obtain, as mentioned, 14 partial bodies 11, from which approximately 1300 plates can be obtained in method step D). The deviation of the thickness of the plates is 5 to 7 μm in this case; the deviation of a cutout having a size of 190×190 μm, for example, is in this case 6 to 8 μm (per 190 μm). The deviation of the dimensions of the converter of 1000×1000 μm is in this case 5 to 6 μm.

Figure 3A:
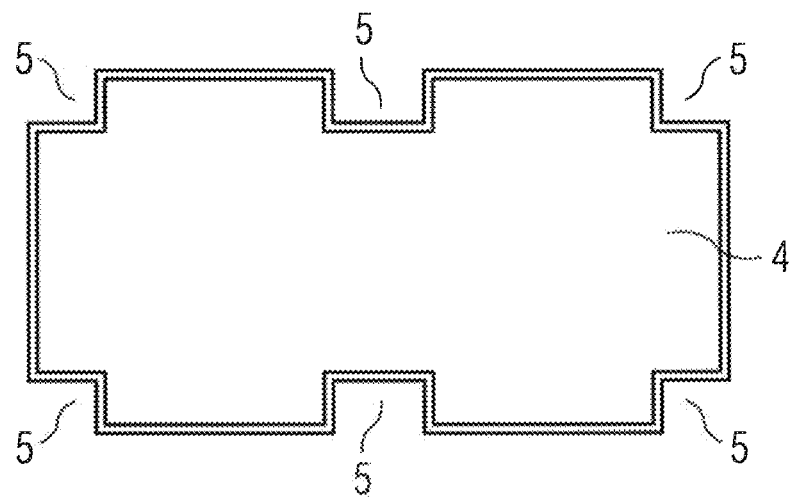
FIGS. 3A and 3B show different embodiments of the luminescence conversion elements that can be manufactured in accordance with the application.

FIG. 3A shows a plan view of the main surface of a luminescence conversion element 4 in the form of a plate having a plurality of cutouts 5 for 8 semiconductor chips 6 with which contact is made in each case by means of a bonding wire.

Luminescence conversion elements having a plurality of cutouts can be used, for example, for an array-like arrangement of luminescence diode chips. Applications of such arrays may include, for example, vehicle headlights or projector light sources. In order to produce such a luminescence conversion element, a step B) has to be effected at least twice, that is to say that both the first and the second main surface of the shaped body have to be provided with, in particular, groove-type or fold-type structurings.

Figure 3B:
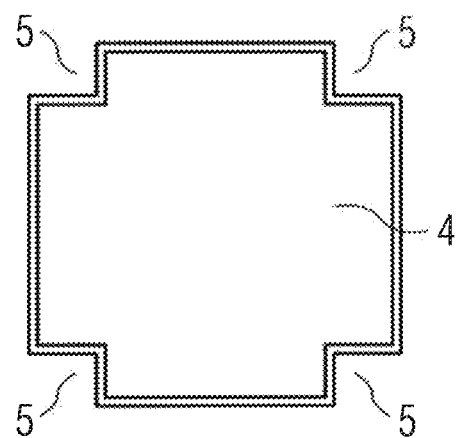

FIG. 3B shows a corresponding arrangement of a luminescence conversion element having four cutouts, that is to say for an array of four LEDs with which contact is made in each case by means of a bonding wire.

Figure 4:
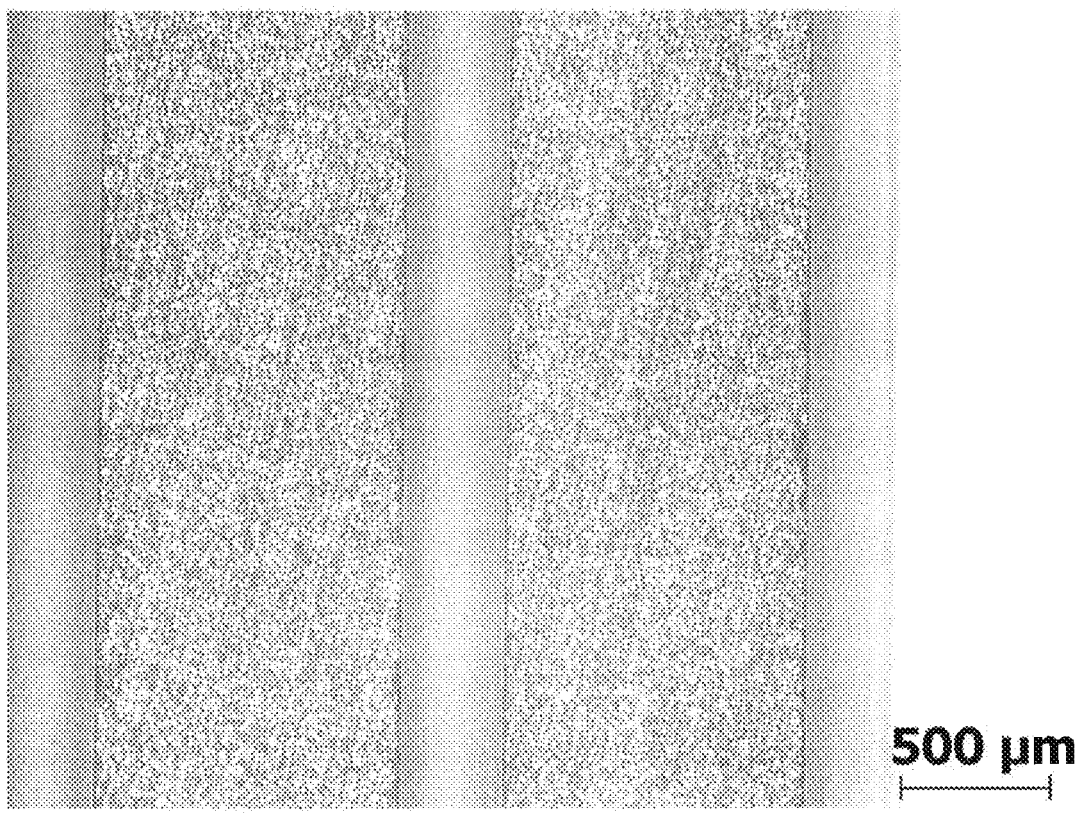
FIG. 4 shows a photograph that captures the surface of a partial body obtained from a shaped body during the production of the luminescence conversion elements.

FIG. 4 shows a photograph that captures the surface of two partial bodies 11 in the form of small rods, on which the traces of the structuring by means of mechanical processing in accordance with step B) or step D) can clearly be recognized.

The invention is not restricted to the exemplary embodiments by the description on the basis of said exemplary embodiments. Rather, the invention encompasses any novel feature and also any combination of features, even if this feature or this combination is not explicitly specified in the exemplary embodiments or patent claims.

The invention claimed is:

1. A method for manufacturing a luminescence conversion element comprising a ceramic material, the method comprising:
   providing a shaped body having a first main surface, a second main surface and a first lateral surface, wherein the shaped body comprises a ceramic material and a luminescence conversion substance;
   forming a fold by processing the first main surface and/or the second main surface of the shaped body applying a grinding or sawing method thereby forming a process shaped body comprising a first processed region, wherein the first processed region extends substantially parallel to the first lateral surface; and
   forming a plurality of the luminescence conversion elements by singulating the process shaped body substantially orthogonally with respect to the first lateral surface.

2. The method according to claim 1, further comprising processing the first main surface and the second main surface to form two partial bodies that comprise a second processed region running substantially parallel to the first lateral surface.

3. The method according to claim 1, wherein the luminescence conversion substance is formed by a doping of the ceramic material.

4. The method according to claim 3, wherein the ceramic material comprises garnets of rare earths or alkaline earth metal elements.

5. The method according to claim 2, further comprising affixing the process shaped body and/or at least one of the partial bodies on an auxiliary carrier.

6. The method according to claim 5, wherein the auxiliary carrier is formed from glass or from ceramic.

7. The method according to claim 1, wherein a distance between the first and second main surfaces of the shaped body corresponds to a distance between opposite side faces of the luminescence conversion element.

8. The method according to claim 7, wherein the distance between the first and second main surfaces of the shaped body is set by grinding at least one of the first and second main surfaces.

9. The method according to claim 1, wherein the shaped body is obtained by sintering a green body manufactured by an injection molding method, by tape casting, by uniaxial pressing, by cold isostatic pressing, by hot pressing or by hot isostatic pressing.

10. The method according to claim 1, wherein each of the luminescence conversion elements has a thickness of 50 to 200 μm.

11. The method according to claim 1, wherein singulating comprises sawing.

12. A ceramic luminescence conversion element having a cutout, the ceramic luminescence conversion element manufactured with the method according to claim 1.

13. The ceramic luminescence conversion element according to claim 12, wherein at least a main surfaces a main surface of the luminescence conversion element has at least partly a structuring for coupling-in and/or coupling-out of radiation.

14. An optoelectronic component comprising a radiation-emitting semiconductor chip and the ceramic luminescence conversion element according to claim 12, wherein the luminescence conversion element converts a primary radiation emitted by the semiconductor chip at least partly into a secondary radiation.

15. A method for manufacturing a luminescence conversion element comprising a ceramic material, the method comprising:
providing a shaped body having a first main surface, a second main surface and a first lateral surface, wherein the shaped body comprises a ceramic material and a luminescence conversion substance;
forming a fold by processing the first main surface and/or the second main surface of the shaped body applying a grinding or sawing method thereby forming a first processed region, wherein the first processed region extends substantially parallel to the first lateral surface; and
forming a plurality of the luminescence conversion elements by cutting the process shaped body substantially orthogonally with respect to the first lateral surface, wherein main surfaces of the singulated luminescence conversion element are formed by the cutting.

16. The method according to claim 1, wherein the ceramic material takes a proportion by weight of more than 75% of the luminescence conversion element.

\* \* \* \* \*

UNITED STATES PATENT AND TRADEMARK OFFICE
CERTIFICATE OF CORRECTION

PATENT NO. : 9,299,878 B2
APPLICATION NO. : 13/881995
DATED : March 29, 2016
INVENTOR(S) : Mikael Ahlstedt Page 1 of 1

It is certified that error appears in the above-identified patent and that said Letters Patent is hereby corrected as shown below:

In the Claims

In Col. 11, line 29, claim 13, delete "a main surfaces".

Signed and Sealed this
Seventh Day of June, 2016

Michelle K. Lee
*Director of the United States Patent and Trademark Office*